(12) United States Patent
Patil et al.

(10) Patent No.: US 9,398,682 B2
(45) Date of Patent: Jul. 19, 2016

(54) DEVICES AND METHODS FOR COOLING COMPONENTS ON A PCB

(71) Applicant: Control Techniques Limited, Newtown (GB)

(72) Inventors: Shashikant Dhondopant Patil, Pune (IN); Vinayak Lata Kurkure, Pune (IN); Jonathan Robert Holman-White, Shrewsbury (GB)

(73) Assignee: CONTROL TECHNIQUES LIMITED, Newton (GB)

( * ) Notice: Subject to any disclaimer, the term of this patent is extended or adjusted under 35 U.S.C. 154(b) by 144 days.

(21) Appl. No.: 14/227,528

(22) Filed: Mar. 27, 2014

(65) Prior Publication Data

US 2014/0355211 A1 Dec. 4, 2014

(30) Foreign Application Priority Data

Mar. 28, 2013 (IN) .......................... 1205/MUM/2013
May 31, 2013 (GB) .................................. 1309776.1

(51) Int. Cl.
*H05K 7/20* (2006.01)
*H05K 1/02* (2006.01)
*G06F 1/20* (2006.01)

(52) U.S. Cl.
CPC ............ *H05K 1/0201* (2013.01); *H05K 1/0209* (2013.01); *H05K 7/20909* (2013.01); *H05K 1/0272* (2013.01); *H05K 2201/09063* (2013.01);
(Continued)

(58) Field of Classification Search
CPC . H05K 7/20; H05K 7/20909; H05K 7/20727; H05K 7/14; H01L 23/467; H01L 23/3677; H01L 23/427; G06F 1/20

USPC ............ 361/679.46, 679.47, 679.48, 679.49, 361/679.5, 690–697, 702–712, 715, 361/719–724; 257/706–713, 718–726; 454/184; 165/80.2, 80.3, 80.4, 104.33, 165/121–126, 185; 174/15.1, 16.1, 252, 174/254

See application file for complete search history.

(56) References Cited

U.S. PATENT DOCUMENTS

| | | | |
|---|---|---|---|
| 4,829,774 A * | 5/1989 | Wassibauer ........... | A23L 3/3418 426/419 |
| 6,027,535 A * | 2/2000 | Eberle .................. | H02J 7/0042 361/690 |

(Continued)

FOREIGN PATENT DOCUMENTS

| | | | |
|---|---|---|---|
| EP | 2020739 | 2/2009 | |
| GB | 2382932 | 6/2003 | |
| JP | 2005166777 A * | 6/2005 | ............... H05K 7/20 |

*Primary Examiner* — Michail V Datskovskiy
(74) *Attorney, Agent, or Firm* — Harness, Dickey & Pierce, P.L.C.

(57) ABSTRACT

There is described an electronic assembly comprising a structure and a printed circuit board (PCB) connected to the structure to form a duct. The PCB has a first side arranged to receive one or more heat-generating components, and a second side. The PCB comprises one or more apertures formed therein. The electronic assembly further comprises airflow generating means arranged to generate an airflow along the duct and along the second side of the PCB such that air is forced through the one or more apertures. By forming a duct beneath a PCB and allowing air to be forced through apertures formed in the PCB, more efficient cooling of components on the PCB may be achieved. For example, the position of the apertures may be tailored such that specific components, or specific parts of components, may be exposed to airflow through the apertures.

16 Claims, 12 Drawing Sheets

(52) U.S. Cl.
 CPC  *H05K 2201/09145* (2013.01); *H05K 2203/081* (2013.01)

(56) References Cited

U.S. PATENT DOCUMENTS

| | | | |
|---|---|---|---|
| 6,262,891 B1 * | 7/2001 | Wickelmaier | H05K 7/20909 165/80.4 |
| 6,977,346 B2 * | 12/2005 | Jairazbhoy | H01L 23/3677 174/252 |
| 7,345,876 B2 | 3/2008 | Hong et al. | |
| 7,782,628 B2 | 8/2010 | Sakamoto et al. | |
| 8,169,784 B2 | 5/2012 | Sakamoto et al. | |
| 8,213,178 B2 | 7/2012 | Chen et al. | |
| 8,335,077 B2 * | 12/2012 | Rijken | G01K 1/20 174/252 |
| 8,824,146 B2 * | 9/2014 | Brok | H01L 23/467 165/80.2 |
| 2006/0104025 A1 * | 5/2006 | Wabiszczewicz | H05K 7/20154 361/694 |
| 2006/0120043 A1 * | 6/2006 | Wolford | H05K 1/0272 361/695 |
| 2010/0290183 A1 * | 11/2010 | Rijken | G01K 1/20 361/679.48 |

\* cited by examiner

DEVICES AND METHODS FOR COOLING COMPONENTS ON A PCB

CROSS-REFERENCE TO RELATED APPLICATIONS

This application claims the benefit and priority of Indian Patent Application No. 1205/MUM/2013 filed Mar. 28, 2013 and Great Britain Patent Application No. 1309776.1 filed May 31, 2013. The entire disclosures of the above applications are incorporated herein by reference.

FIELD OF THE INVENTION

The present invention relates to devices and methods for cooling components on a printed circuit board (PCB). In particular, the invention relates to an electronic assembly for cooling one or more heat-generating components on a PCB, as well as to a method of cooling the components using the assembly. The invention furthermore relates to a PCB that may be used with the assembly for the cooling of components on the PCB.

BACKGROUND TO THE INVENTION

Electronic components generate heat as current passes through them. When many such components are installed on a PCB, the heat generated can be relatively concentrated and, if not managed efficiently, risks damage to the components through over-heating, short circuits, etc.

Various methods of cooling electronic components have been designed. Typically, one or more cooling fans are employed to generate airflows over or towards the components. FIG. 1 illustrates an example prior art method of cooling electronic components on a PCB. PCB 10 comprises a plurality of electronic, heat-generating components (in this case, capacitors 12). A fan 14 is disposed at one end of PCB 10 adjacent a connector 18, and is arranged to blow air 16 towards capacitors 12. As illustrated by the different shaded portions A and B on each capacitor 12, only a limited component surface area is exposed to forced air 16 generated by fan 14. In particular, only portions A of capacitors 12 benefit from cooling, whilst portions B receive little or no air 16 from fan 14, and thus little heat is extracted from the surface area of capacitors 12 not in the direct path of forced air 16.

When increased cooling capacity is required, a typical solution is to use additional fans. Whilst multiple fans or air directors may be used to blow air from various different points and in various different directions in order to maximise cooling of the components so that even cooling may be achieved, they may add unnecessary expense. Furthermore, the more fans that are used the greater the likelihood of a fault developing. There therefore remains a need in the art to provide for more efficient means of cooling components on a PCB. The present invention seeks to address this and other deficiencies encountered in the prior art.

SUMMARY OF THE INVENTION

In accordance with a first aspect of the present invention, there is provided an electronic assembly comprising a structure and a PCB connected to the structure to form a duct. The PCB has a first side arranged to receive one or more heat-generating components, and a second side. The PCB comprises one or more apertures formed therein. The electronic assembly further comprises airflow generating means arranged to generate an airflow along the duct and along the second side of the PCB such that air is forced through the one or more apertures.

The structure may take various forms, and may be for example a housing, structural support, or some other physical arrangement that may be joined, coupled, fixed or otherwise connected to the PCB. The PCB should be held to include any platform or board upon which electrical components or electrical contacts may be formed. The duct formed by the interconnection of the PCB and the structure may take various different shapes and have various different dimensions. The duct may be elongate and rectangular in shape or cross-section, or may form a chamber beneath the PCB. The generated airflow may be substantially parallel to the PCB, and in other embodiments the air may flow at an angle relative to the PCB. The heat-generating components may be any components configured to emit heat. They generally comprise electronic components but other sources of heat are contemplated within the disclosure. The first side of the PCB may be the side facing away from the duct, or in other words may be the side of the PCB external or exterior to the duct. In particular, the first side of the PCB may face away from the duct such that heat-generating components received on the first side of the PCB are exterior to the duct. The second side of the PCB may be the side facing the duct and forming a wall or ceiling of the duct. The apertures may comprise apertures not necessarily intended for the passage of airflow, and for example may comprise apertures designed for wiring or fasteners and yet through which air may be forced. The airflow generating means may comprise means, such as a fan, of pushing air along the duct and subsequently through the one or more apertures, and in other embodiments may be a vacuum device arranged to pull or suck air along the duct, thereby sucking air through the one or more apertures. Thus, the airflow generating means may be arranged to generate an airflow such that air is pushed or pulled through the one or more apertures. The duct so formed by the interconnection of the PCB and the structure may be substantially sealed such that the forcing of air through the one or more apertures may be made more efficient. The assembly may be modular in that it may be removed from one system, device or apparatus and readily installed in another.

By forming a duct beneath a PCB and allowing air to be forced through apertures formed in the PCB, more efficient cooling of components on the PCB may be achieved. For example, the position of the apertures may be tailored such that specific components, or specific parts of components, may be exposed to airflow through the apertures. Furthermore, electrical contacts on the second side of the PCB may be exposed to cool air flowing along the duct. The inventive assembly may further comprise a fan (such as the one seen in FIG. 1) arranged to blow or direct air towards components from above the PCB, whilst the duct may provide means for allowing airflow to be directed from below the PCB. In this manner, increased cooling efficiency may be achieved. It should be noted that if a fan or other airflow generating means is arranged to generate an airflow along the first side of the PCB, such an airflow should be configured so as not to counteract the airflow generated along the duct. Such a configuration may be achieved by adjusting the strength of the airflow along the first side of the PCB, adjusting the direction of the airflow, etc.

At least a portion of the periphery of the PCB may be contoured such that an aperture for allowing airflow therethrough is formed between the structure and the periphery of the PCB. Whilst PCBs are generally rectangular in shape, the PCB of the present invention may have a periphery that is contoured, profiled or otherwise shaped in such a way as to reduce the width of the PCB at certain points. When the PCB is joined or connected to the structure, an aperture may effectively be formed between a side wall of the structure and the edge or periphery of the PCB. Air from within the duct may therefore pass between the duct and the duct's exterior, via such apertures formed by the combination of the contouring of the PCB's edge and the structure. Furthermore, by forming contoured portions along the periphery of the PCB as opposed to forming apertures wholly within the PCB itself, the structural integrity of the PCB may be preserved.

The first side of the PCB may comprise one or more component areas each arranged to receive one or more heat generating-components. Component areas are generally virtual areas for placement of a component thereon. They need not be physically marked out on the PCB. For example, during machining or fabrication of the PCB, a component area may be decided upon simply based on the positions of any contoured portions in the periphery of the PCB. Alternatively, the component areas may be predefined on the PCB before machining of the PCB is to take place. A component area may take any suitable shape designed to set the boundaries for placement of a component to be received in the component area. For example, if the component is a capacitor, a suitable virtual circular component area may be set out on the first side of the PCB, and the capacitor may be placed therein when ready. Prior to placement, a suitable portion of the PCB's periphery may be contoured, for example adjacent the component area.

The contoured portion of the PCB may be adjacent one of the one or more component areas, and may be contoured inwardly towards the component area. The contoured portion may at least partially conform to a shape of a heat-generating component to be received in the component area. By positioning contoured apertures adjacent areas of the PCB designated for component placement, more efficient and selective cooling of the components may be achieved when the ducting principle described herein is used. The one or more apertures may be formed in the PCB such that the air forced through the one or more apertures may flow adjacent the one or more component areas. A contoured portion of the PCB may be said to be adjacent a component area/component if the contoured portion is as close as possible to the component area/component, or if at least a portion of the contouring results in a distance between the component area/component and the PCB's edge being reduced. Furthermore, by partially conforming the profile or contour of the PCB to a shape of the component, further assisted cooling is provided, as the air forced through the aperture will be in closer proximity to the component and therefore more efficient at removing heat from it. The conforming of the contour to the shape of the component need only follow or mirror the component's shape for a short distance, as even such a conformation improves the cooling efficiency of the assembly.

Each component area may comprise an upstream area and a downstream area defined relative to the airflow along the duct. The one or more apertures may be formed in the PCB such that the air forced through the one or more apertures flows adjacent the one or more downstream areas. Thus, whilst an upstream (relative to the generated airflow) portion of a component may receive air from a cooling fan positioned on the first side of the PCB, downstream portions of components not in the direct path of air from the fan may benefit from cooling from air passing along the duct and up through the apertures in the PCB. Thus, a substantial portion of the surface area of a component may be exposed to cool airflow and cooled more fully as a result.

The structure may comprise a plurality of PCBs arranged in relation to each other such that the duct comprises an n-sided polygonal cross-section. N may be an integer greater than 2. Thus, whilst the structure may typically be formed of plastic, it may comprise or be entirely formed of multiple PCBs that cooperate with the apertured PCB to form a duct by themselves.

In one particular aspect of the invention, a duct or conduit may be formed of a plurality of structural boards such that the conduit has an n-sided polygonal cross-section. If n=3, at least one of the boards may be a PCB; if n=4 and if the cross-section of the conduit is rectangular, at least two or three of the boards may be PCBs; and if n>4, at least one of the boards may be a PCB. At least one of the PCBs may comprise apertures formed therein for allowing air to be forced therethrough, either into or out of the duct. Such airflow may cool downstream portions of components on the one or more PCBs.

In a second aspect of the invention, there is provided a method for cooling heat-generating components on a PCB. The method comprises connecting the PCB to a structure so as to form a duct. The PCB has a first side arranged to receive one or more heat-generating components, and a second side. The PCB comprises one or more apertures formed therein. The method further comprises generating an airflow along the duct and along the second side of the PCB so as to force air through the one or more apertures. Such a method allows for a more efficient cooling of components on a PCB and in particular allows for cooling of component areas not normally exposed to fan air directed along the outside the duct and along the first side of the PCB.

In a third aspect of the invention, there is provided a PCB comprising on a surface thereof a component area arranged to receive a heat-generating component. A portion of the periphery of the PCB, adjacent the component area, is contoured inwardly towards the component area.

Apertures formed within the PCB itself and not along its periphery generally compromise at least to some degree the structural integrity of the PCB. Thus, by providing contoured portions along the periphery of the PCB, the structural integrity of the PCB is not overly weakened. Advantageously, the contoured PCB may be combined with a structure to form a duct as explained above. When combined with a structure, as well as maintaining the structural integrity of the PCB, the contouring provides apertures in the PCB for allowing airflow therethrough.

The contoured portion of the PCB may at least partially conform to a shape of the heat-generating component to be received in the component area.

The component area may comprise the area of the PCB taken up by the heat-generating component when received thereon.

The PCB may be connected to a structure so as to form a duct. Airflow generated within the duct may be forced through the contoured portions of the PCB, the contoured portions forming apertures with the structure when the PCB is connected to the structure.

Further features of the invention are described below, and may form part of any of the embodiments described above.

The invention relates to airflow management in motor controllers/power converters using contoured PCBs. The contoured profile of the PCB may be designed to provide air exit paths for uniform air distribution and for blowing appropriate amounts of air over hot components. This contoured profile may be unique to the location and geometry of heat-producing components on the PCB. Forced air from a system fan located below a waistline (see FIGS. 6 and 7) may be deflected, directed and redistributed above the waistline of the product. This arrangement may be suitable for any motor drives/power converters, such as AC drives.

The invention further relates to a system with a conduit formed by unique profiling of PCBs and adjacent parts. Any product where a forced air cooling method and one or more PCBs are used may benefit from the invention. The invention may be used to cool components mounted on the PCBs, as well as electrical contacts on the underside of the PCB. The invention may be further used to cool all hot components in an electronic enclosure that are not located directly in the path of airflow from a system fan.

Air blown from a system fan may be directed from below the waistline to above the waistline of the product using predetermined geometrical shapes (such as vents, ramps, etc.) in an enclosure. This air may be deflected, directed and redistributed through the conduit formed by one or more PCBs and walls of a structure, such as a plastic structure. This airflow along the length of the PCB may cool the contacts on the underside of the PCB. The arrangement may also help to form a compartment preventing a flow of preheated air from hot components over their neighbouring components. The PCB may serve the dual function of supporting electrical components and electrical connections, and forming walls of the conduit. The components mounted on the PCB are cooled from air routed through the contours/profiles provided on the PCB. Thus, a greater area of the components is exposed to the air, thereby providing more efficient cooling. Air from a fan is forced to flow beneath the PCB, distributed and directed upwards around the components. Holes and contours on the PCB are designed through which fresh air is directed and distributed over the components.

With the present invention, both sides of a PCB may be cooled, which can be useful in the case of a double-sided component board. The PCB itself may be used to distribute air without the addition of any additional physical part acting as an air guide. The arrangement/concept can be used in any product where single or multiple PCBs are used. Such products include power converters, computer SMPS, industrial and commercial SMPS, industrial control panels, and the invention may furthermore be used in any application which uses a forced air cooling method.

BRIEF DESCRIPTION OF THE DRAWINGS

Preferred embodiments of the invention will now be described in connection with the drawings, in which.

DETAILED DESCRIPTION OF PREFERRED EMBODIMENTS

The present invention seeks to provide improved devices and methods for cooling electronic components on a PCB. Whilst various embodiments of the invention are described below, the invention is not limited to these embodiments, and variations of these embodiments may well fall within the scope of the invention which is to be limited only by the appended claims.

Figure 1:
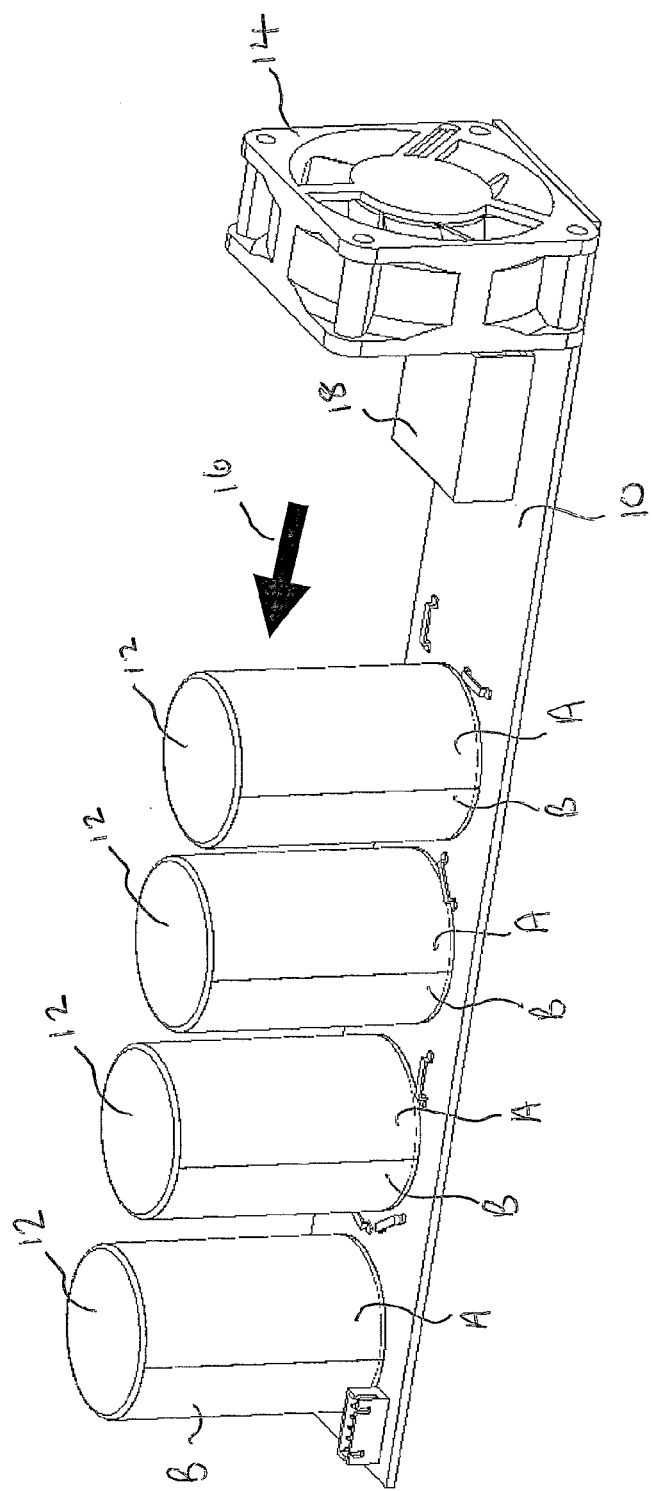
FIG. 1 is a perspective view of a prior art method of cooling components on a PCB.
Figure 2:
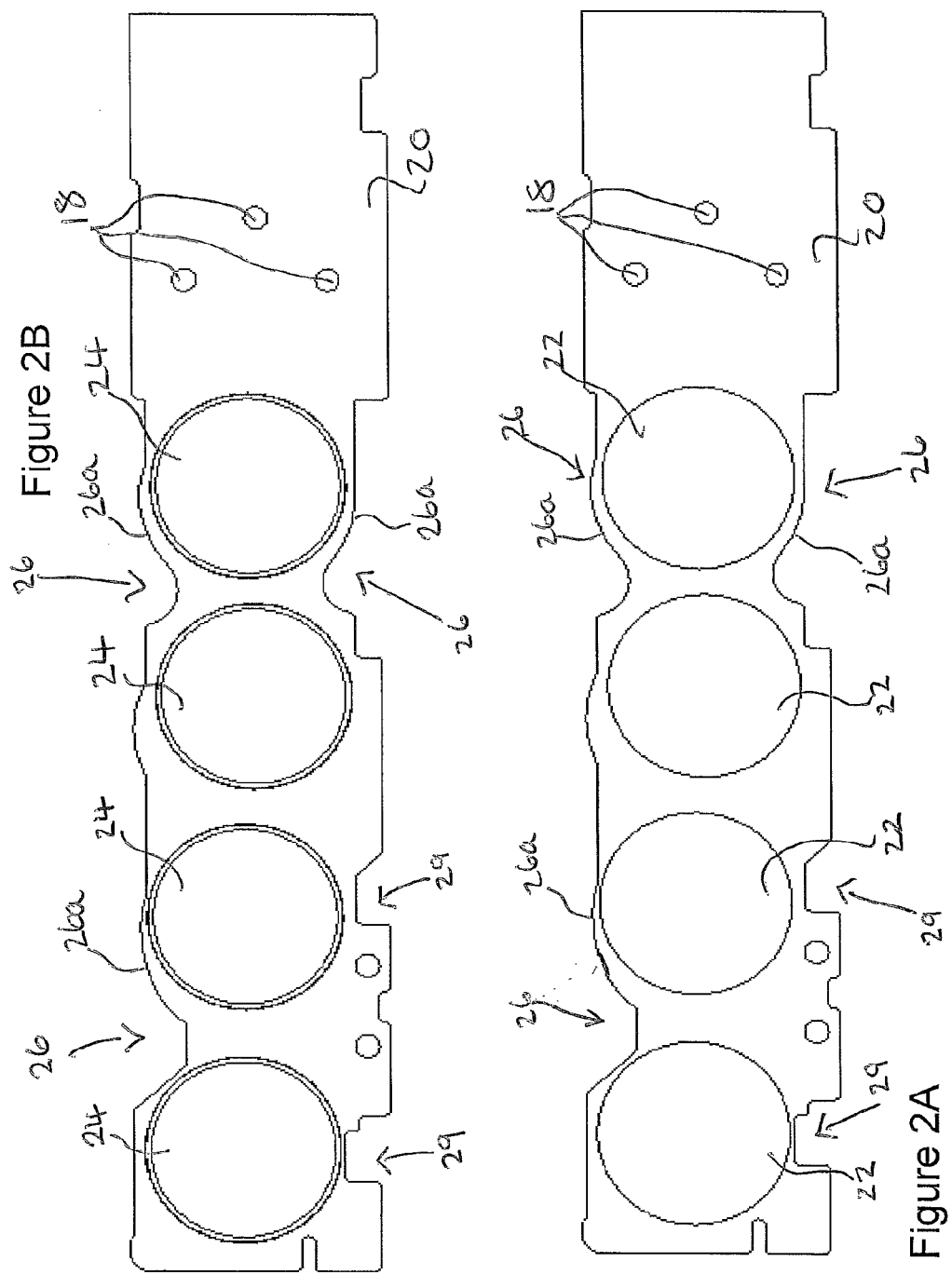
FIG. 2A is top-down view of a PCB in accordance with a preferred embodiment of the present invention.
FIG. 2B is a top-down view of the PCB of FIG. 2A with components received thereon.

In accordance with a first embodiment of the present invention, there is shown in FIGS. 2A and 2B a contoured PCB 20. In particular, FIG. 2A shows PCB 20 from above prior to having components installed or otherwise received thereon, whilst FIG. 2B shows PCB 20 with capacitors 24 received thereon. In FIG. 2A, PCB 20 comprises four circular component areas 22, each arranged to receive one of capacitors 24. Other shapes of component areas may be used, and their position on PCB 20 may vary from one embodiment to the other. For example, component areas 22 may be rectangular-shaped. Component areas 22 may be virtual areas on PCB 20 and used to identify the locations of components (such as capacitors 24) to be installed on PCB 20. Furthermore, if greater or fewer numbers of components are needed on PCB 20, then the number and shape of component areas 22 may be varied accordingly. For clarity, component areas 22 are not shown in FIG. 2B, as capacitors 24 have been installed on PCB 20.

PCB 20 further comprises a number of contoured edges or portions 26. Contoured portions 26 are formed along the periphery of PCB 20 such that the periphery of PCB 20 is in places shaped or profiled inwardly, towards component areas 22. For example, contoured portions 26 adjacent component areas 22 result in the width of PCB 20 being less than what it would be if the periphery of PCB 20 were not contoured. In FIG. 2B, it can be seen that contoured portions 26 at least partially conform to the circular shape of capacitors 24. In particular, contoured portions 26 each comprise a curved portion 26a that at least partially mirrors, matches or conforms to the circular shape of capacitors 24.

Central apertures 18 are also formed in PCB 20, and are typically sized and configured to allow fasteners therethrough for fixing components or the like to the surface of PCB 20. If no such fasteners are used with central apertures 18, then central apertures 18 may allow for the passage of air therethrough. PCB 20 also further comprises contoured edges or portions 29 adjacent some of component areas 22. In the present embodiment, contoured portions 29 do not substantially mirror or conform to a shape of capacitors 24, but instead have a rectangular or linear outline. In other embodiments, contoured portions 29 may at least partially conform to a shape of the components to be received in component areas 22.

Figure 3:
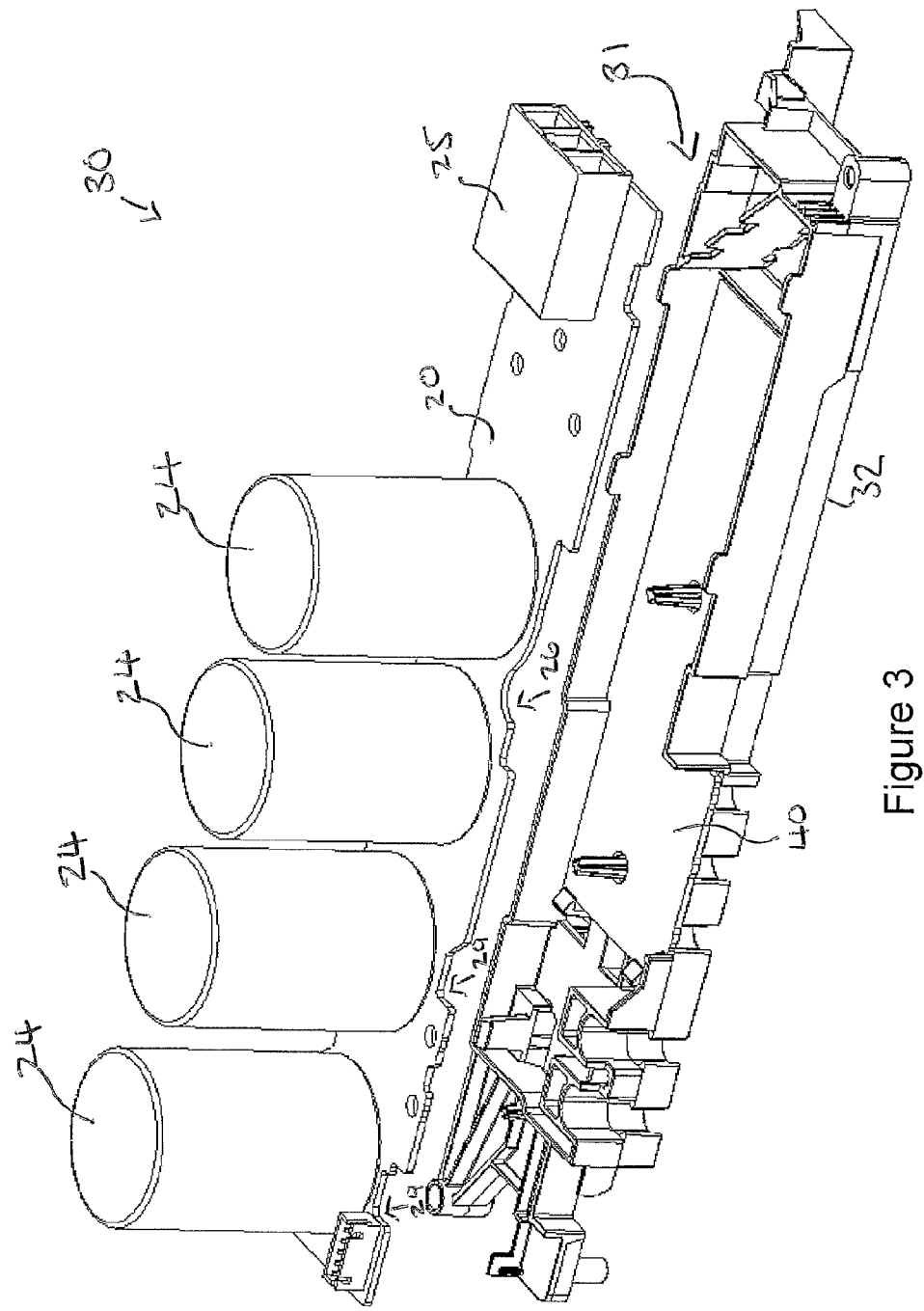
FIG. 3 is an exploded perspective view of an electronic assembly in accordance with a preferred embodiment of the present invention.

In accordance with a second preferred embodiment of the present invention, there is shown in FIG. 3 an electronic assembly or module 30 comprising a duct, conduit or chamber 31 formed by the interconnection of a structure 32 and a first PCB 20. Structure 32 may take various forms and in the present embodiment is comprised of a plastic component, housing or shell having two pairs of opposing walls. A second PCB 40 is positioned within duct 31 so as to form a floor or lower wall portion of duct 31. PCB 20 (which in the present embodiment is PCB 20 described in connection with FIGS. 2A and 2B) is connected to structure 32 along the upper edges of structure 32, thereby forming a ceiling or upper wall portion of duct 31 (see FIG. 4). PCB 20 has multiple heat-generating components disposed on a first side of PCB 20, in designated component areas (not shown). In this case, heat-generating components are capacitors 24, although any number and type of components may be received on PCB 20. An electrical connector 25 is disposed at one end of PCB 20. The first side of PCB 20 faces outwardly away from duct 31. Although in the present embodiment there is no fan on the first side of PCB 20, in other embodiments there may well be a fan or some other airflow generating means arranged to blow or otherwise direct an airflow towards capacitors 24.

Figure 4:
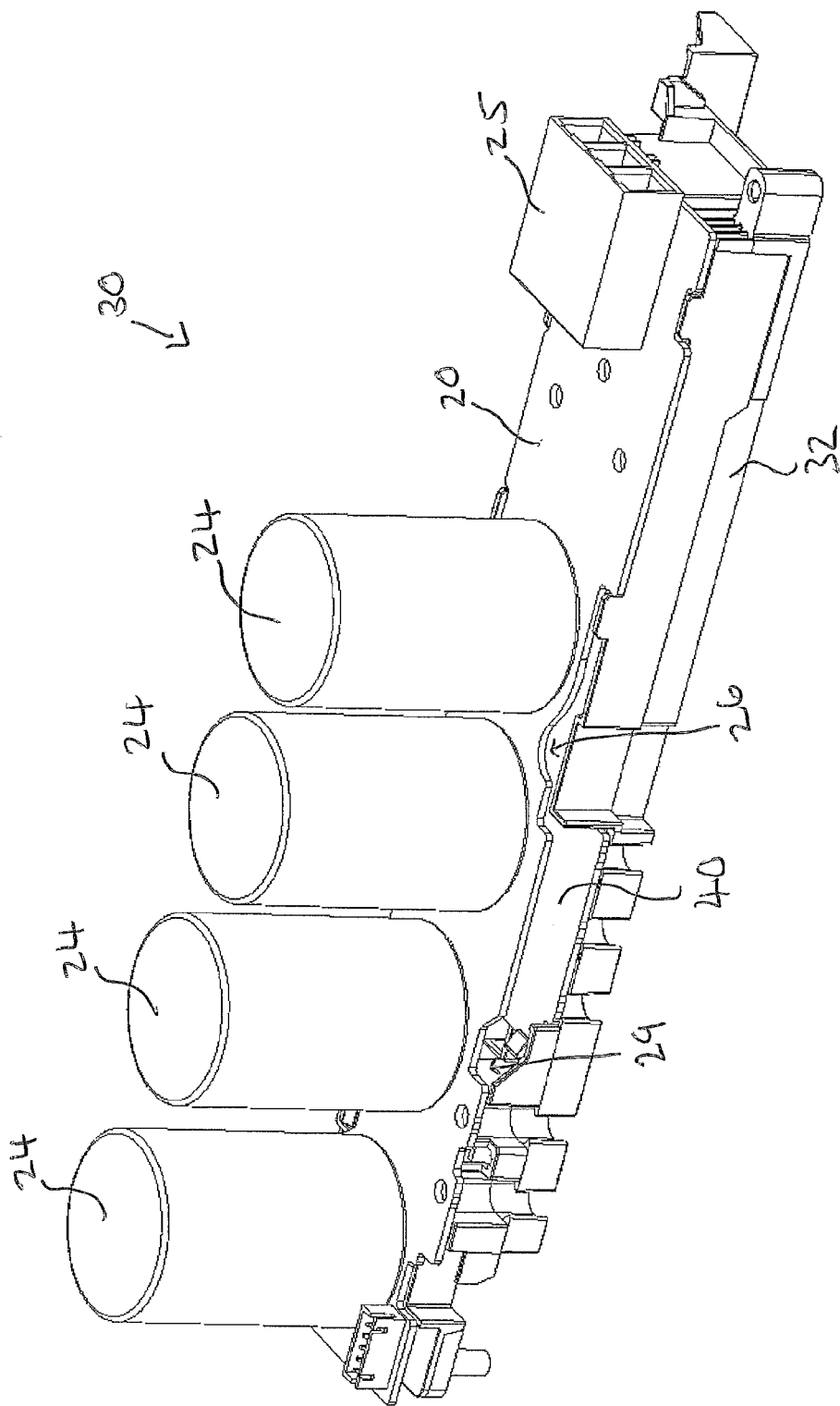
FIG. 4 is a perspective view of the electronic assembly of FIG. 3.

The completed electronic module or assembly 30 may be seen in FIG. 4. As can be seen in FIG. 4, PCB 20 has been coupled or joined to structure 32, thereby largely hiding duct 31 and PCB 40 from view. Thus, duct 31 is formed of the interconnection of PCBs 20 and 40 with structure 32, with structure 32 providing the side walls and PCBs 20 and 40 providing respectively the ceiling and floor of duct 31. When PCB 20 is interconnected or otherwise joined to housing or structure 32, contoured apertures 26 and 29 are formed between structure 32 and the contoured peripheral portions of PCB 20. Such apertures 26 and 29 allow air to pass from duct 31 out towards capacitors 24 on the first side of PCB 20, and vice versa.

Figure 5:
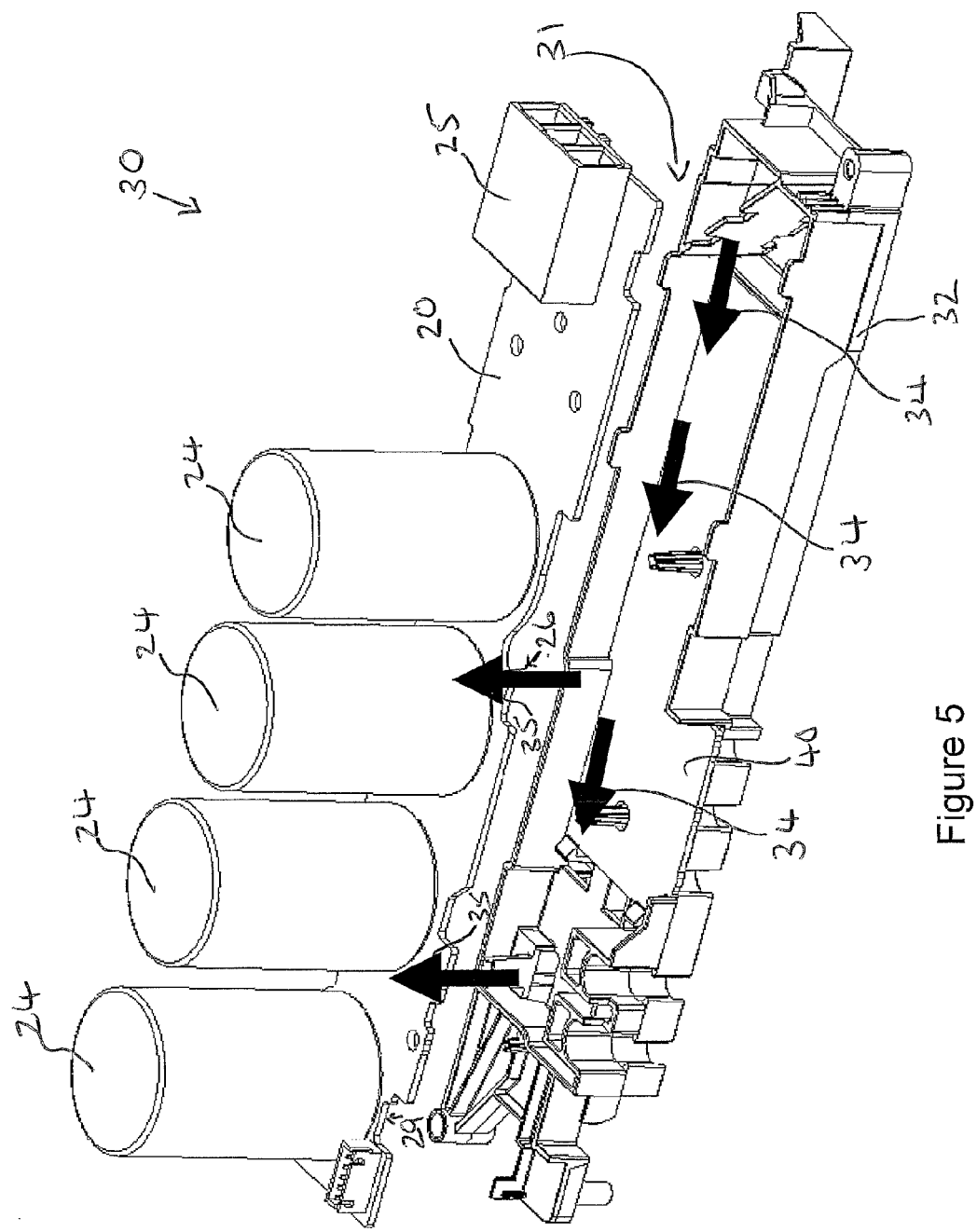
FIG. 5 is an exploded perspective view of the electronic assembly of FIGS. 3 and 4, in use.

FIG. 5 shows electronic assembly 30 in use. During operation, airflow generating means (not pictured) are arranged to generate an airflow along duct 31 and along the second side of PCB 20. The second side of PCB 20 is the side facing inwardly towards duct 31. The airflow generated along duct 31 is identified by arrows 34. As duct 31 is substantially sealed by the joining of PCB 20 to structure 32, air in duct 31 is forced and in particular pushed through contoured apertures 26 and 29. In particular, as illustrated by arrows 35, air passes through contoured apertures 26 formed by means of the contouring of the periphery of PCB 20. Contoured apertures 26 and 29 are located adjacent downstream portions of capacitors 24. In the present embodiment, downstream portions of capacitors 24 are the portions that are furthest from connector 25, downstream being measured relative to the direction of airflow 34. Thus, the sides of capacitors 24 not facing connector 25 may be cooled by means of forced air passing along duct 31 and through contoured apertures 26 and 29. Whilst contoured apertures 29 are generally used for wiring to pass therethrough, air in duct 31 may also be forced through contoured apertures 29. If a fan is included with assembly 30 and arranged to generate an airflow on the first side of PCB 20, then the upstream portions of capacitors 24 may be cooled simultaneously with their downstream portions.

It should be noted that the flow of air in duct 31 could be reversed such that, instead of being pushed through contoured apertures 26 and 29, air may be pulled through contoured apertures 26 and 29. Such an airflow proximal or adjacent component areas 22 and capacitors 24 may cool capacitors 24 by exchanging hot air for cooler air, much in the same way as if air were pushed through contoured apertures 26 and 29.

It should also be noted that PCB 40 may comprise electronic components disposed thereon and within duct 31, to benefit from the cool airflow generated within duct 31. In such a case, it may be preferable to increase airflow 34 in duct 31 such that both components on PCB 20 and PCB 40 may receive sufficient cool air.

Figure 6:
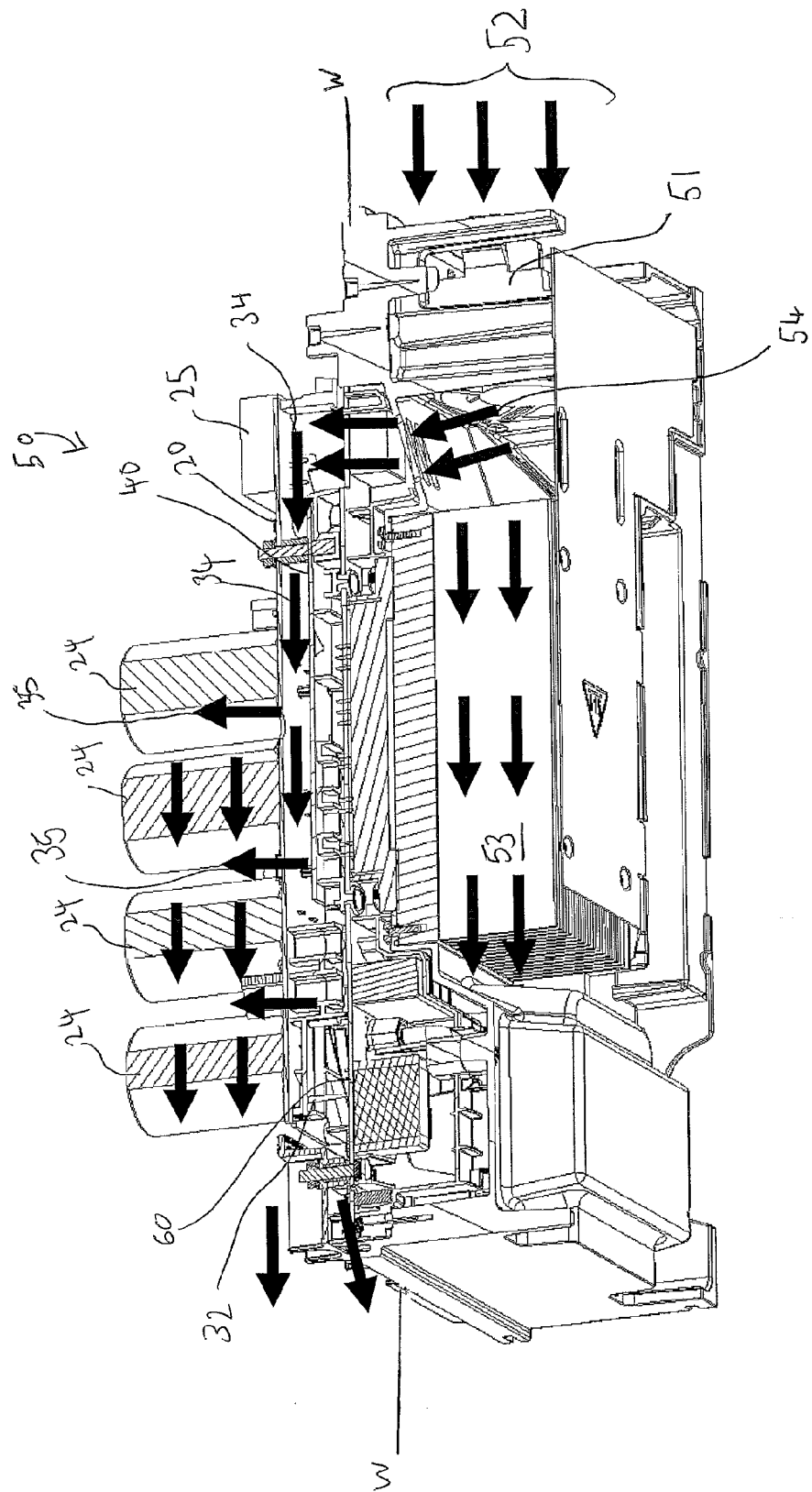
FIG. 6 is a perspective view of the electronic assembly in use with an AC drive.
Figure 7:
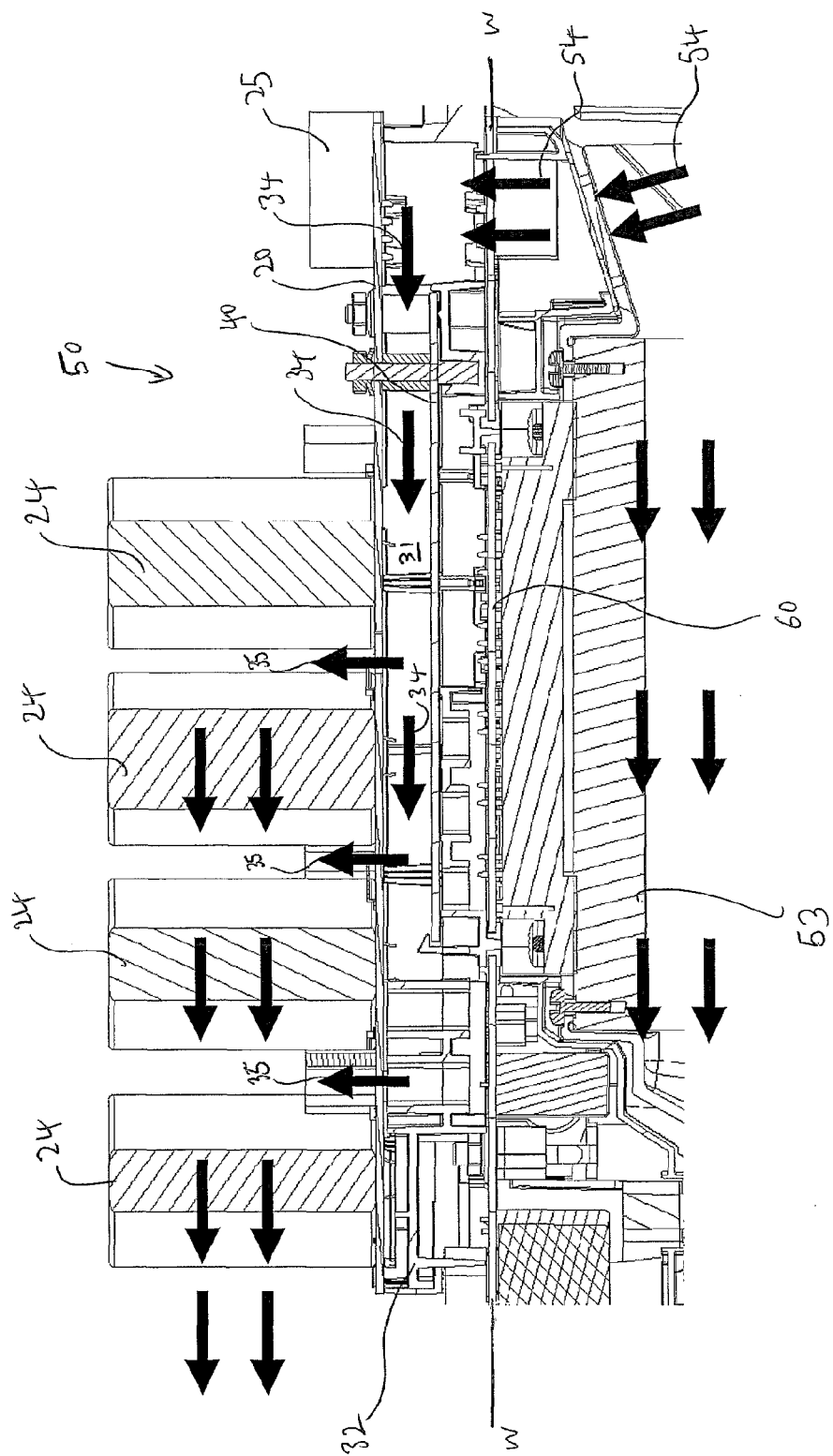
FIG. 7 is a side-on cross-sectional view of the AC drive of FIG. 6.

FIGS. 6 and 7 illustrate an AC drive 50 wherein the inventive electronic assembly 30 is used to assist the cooling of capacitors 24. In this embodiment, airflow generating means 51 is disposed below the so-called waistline W of AC drive 50. A substantial portion of the air intake 52 generated by airflow generating means 51 (typically a fan) is directed onto an aluminium heat sink 53. A smaller portion of air intake 52, designated by arrows 54, is redirected using geometrical shaping of the AC drive's housing such as through the use of ramps, slopes or the like, and forced along duct 31 and subsequently up through contoured apertures 26 and 29 in PCB 20 in the manner described above, thereby resulting in cooling of the downstream or rearward portions of capacitors 24. Although not present in the instant embodiment, a fan or other airflow generating means may be positioned above waistline W and may be arranged to direct airflow directly onto the connector-facing portions of capacitors 24, thereby combining with the cooling effect of airflow 34 to increase and improve cooling of capacitors 24.

It should be noted that AC drive 50 comprises a third PCB 60 positioned below PCBs 20 and 40. PCB 60 may comprise further components thereon, and it could be envisaged that, together with PCB 40, a second duct may be formed directly below duct 31. Using apertures formed within PCB 40, cool air passing along this second duct may cool components received on PCB 60, and subsequently be forced through the apertures in PCB 40, joining air in duct 31. By positioning apertures in PCB 40 in a manner that is adjacent to components on PCB 40, both the upstream and downstream portions of these components may be cooled, in much the same way as the upstream and downstream portions of capacitors 24 may be cooled. Heat sink 53 is configured to assist in the cooling of components on PCB 60.

In the embodiment of FIGS. 6 and 7, the temperatures of capacitors 24 were measured under two different circumstances. In the first instance the temperature of capacitors 24 was measured without them being subjected to any forced air, but instead undergoing cooling through natural convection and radiation. In the second instance, portion 54 of the airflow generated by airflow generating means 51 was directed along duct 31 and through contoured apertures 26 and 29 to cool the downstream portions of capacitors 24.

| Capacitor | Temperature without any forced airflow | Temperature with airflow along duct and through contoured apertures | Maximum temperature limits |
| --- | --- | --- | --- |
| Capacitor 1 | 112° C. | 92.3° C. | 102° C. |
| Capacitor 2 | 116° C. | 85.6° C. | 102° C. |
| Capacitor 3 | 106° C. | 91.5° C. | 102° C. |
| Capacitor 4 | 108° C. | 84.3° C. | 102° C. |

As would be appreciated by a person skilled in the art, these results were obtained under particular experimental conditions using a specific embodiment of the invention, and the results may vary depending on the particular nature and specifications of the components involved, the airflow and fan parameters, etc.

It should furthermore be noted that airflow generating means or fan 51 need not be positioned as shown in FIGS. 6 and 7, and indeed may be positioned in any position allowing an airflow to be generated along duct 31 and along the second side of PCB 20.

Figure 8A:
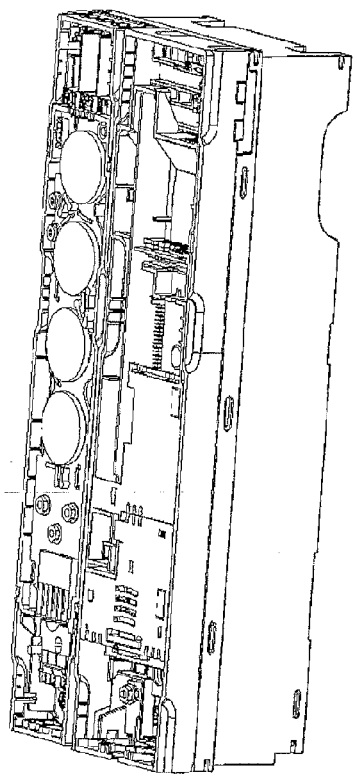
FIG. 8A is a first perspective cross-sectional view of the AC drive.
Figure 8B:
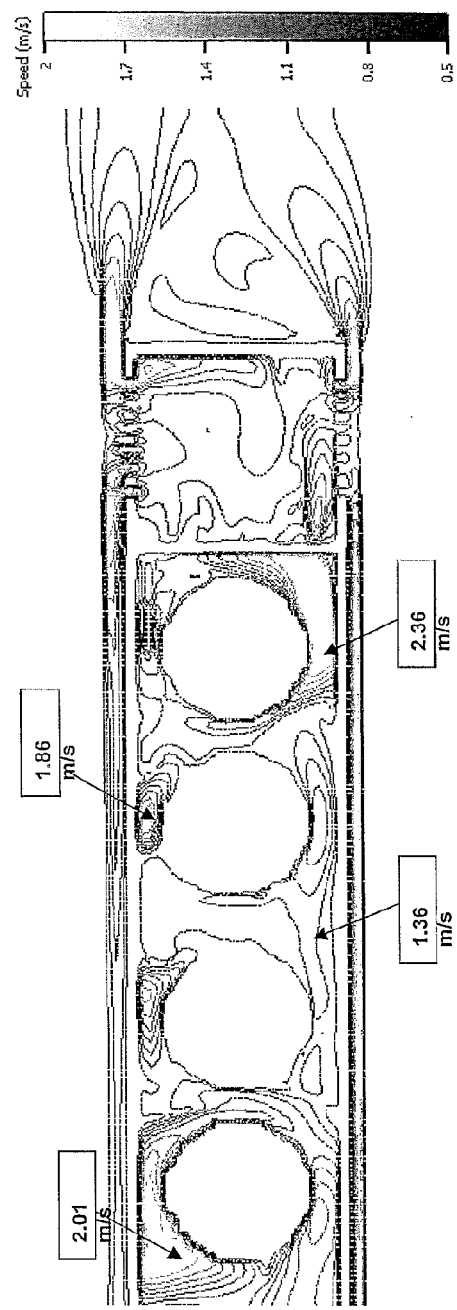
FIGS. 8B and 8C show first speed and temperature profiles of airflow through the AC drive along the cross-section of FIG. 8A.
Figure 8C:
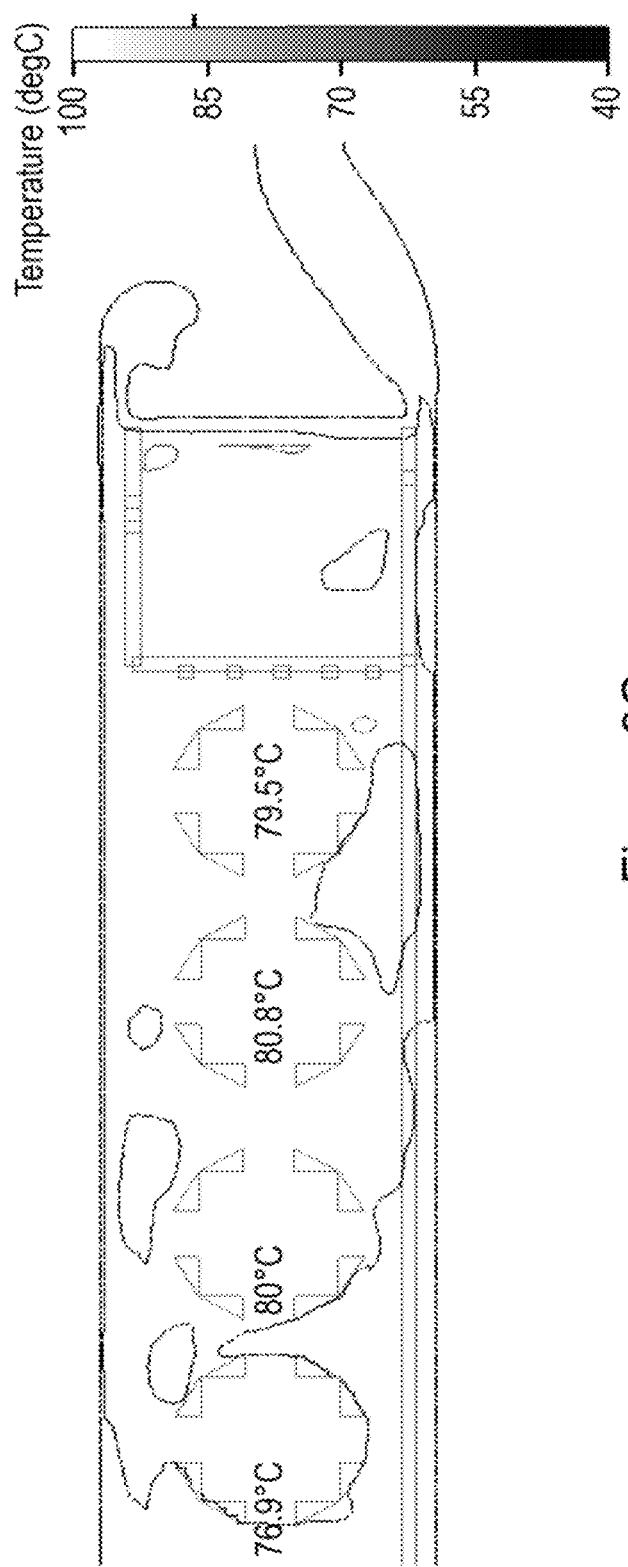
Figure 9A:
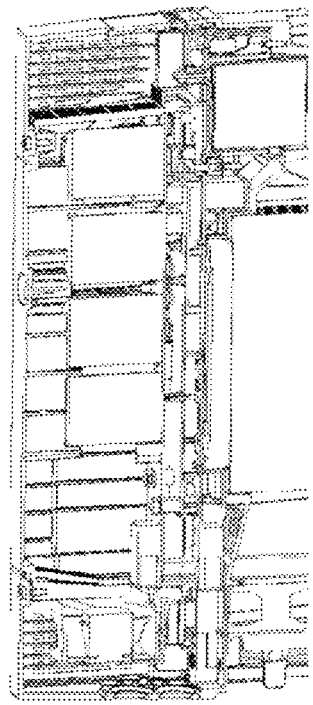
FIG. 9A is a second perspective cross-sectional view of the AC drive.
Figure 9B:
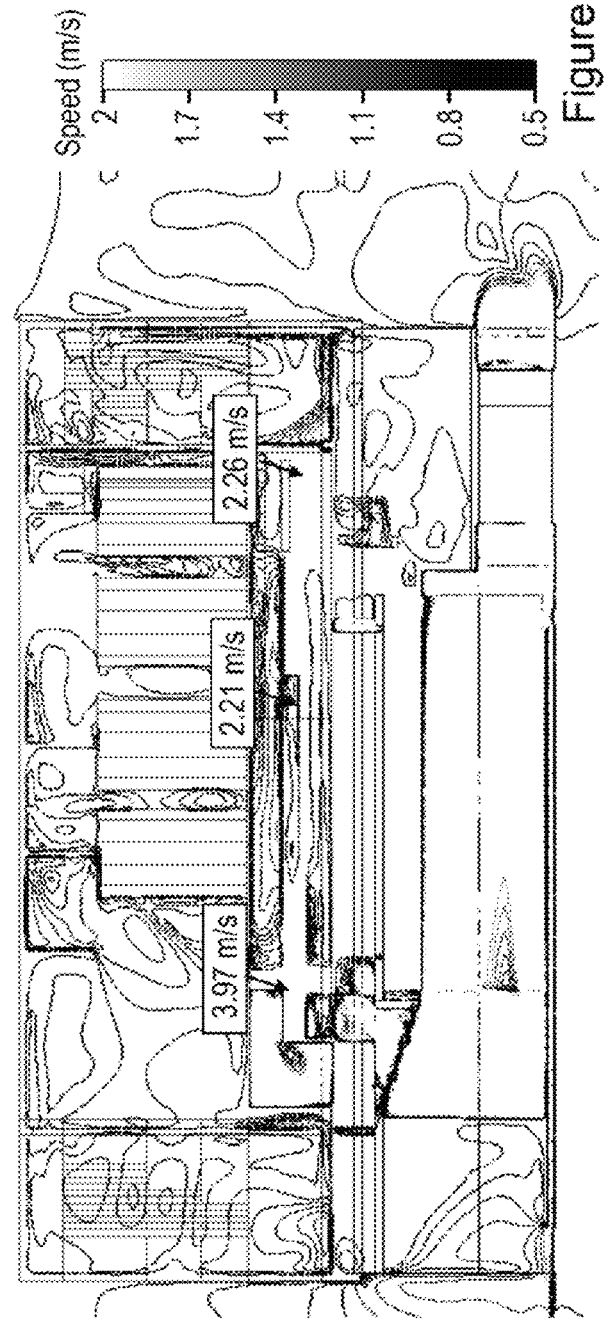
FIGS. 9B and 9C show second speed and temperature profiles of airflow through the AC drive along the cross-section of FIG. 9A.
Figure 9C:
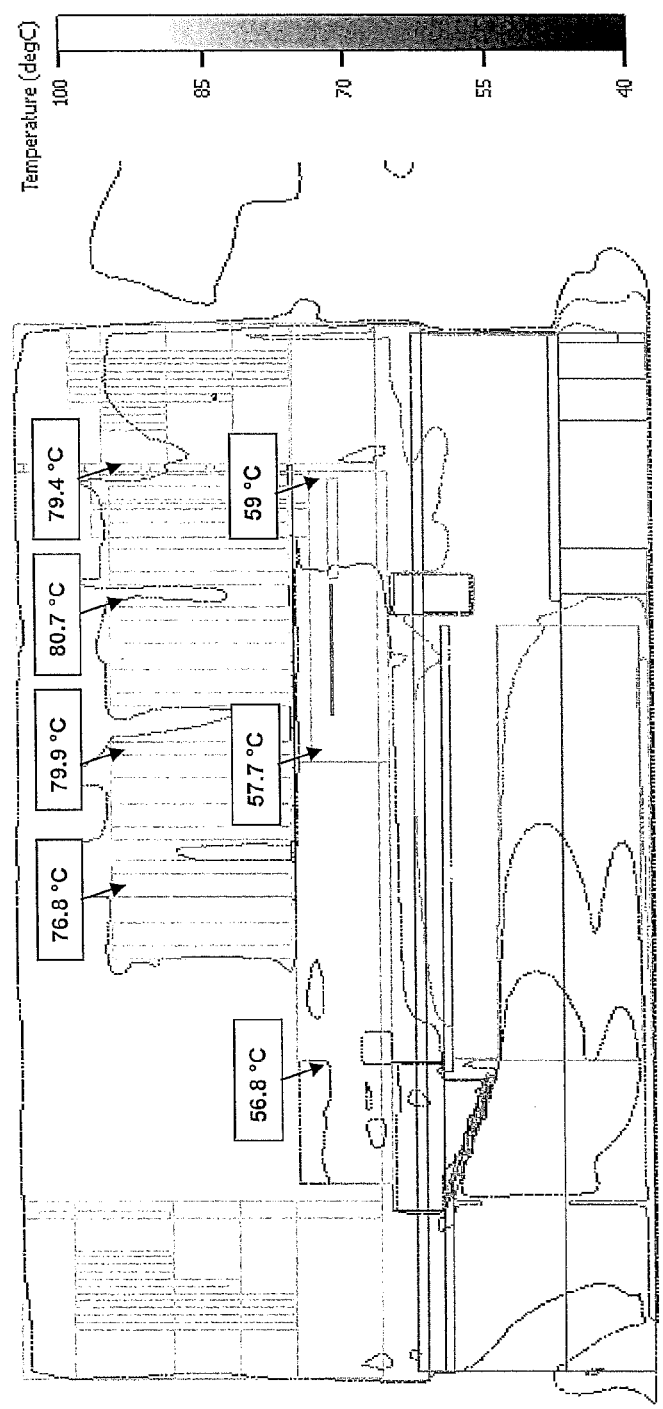

FIGS. 8B and 8C show colour-coded profiles of airspeed and temperature of the air within AC drive 50 when being operated. The cross-section is taken through a y-plane as illustrated by FIG. 8A. Likewise, FIGS. 9B and 9C show similar colour-coded profiles of airspeed and temperature of the air within AC drive 50 when being operated. This time, the cross-section is taken through a z-plane as illustrated by FIG. 9A.

Figure 10:
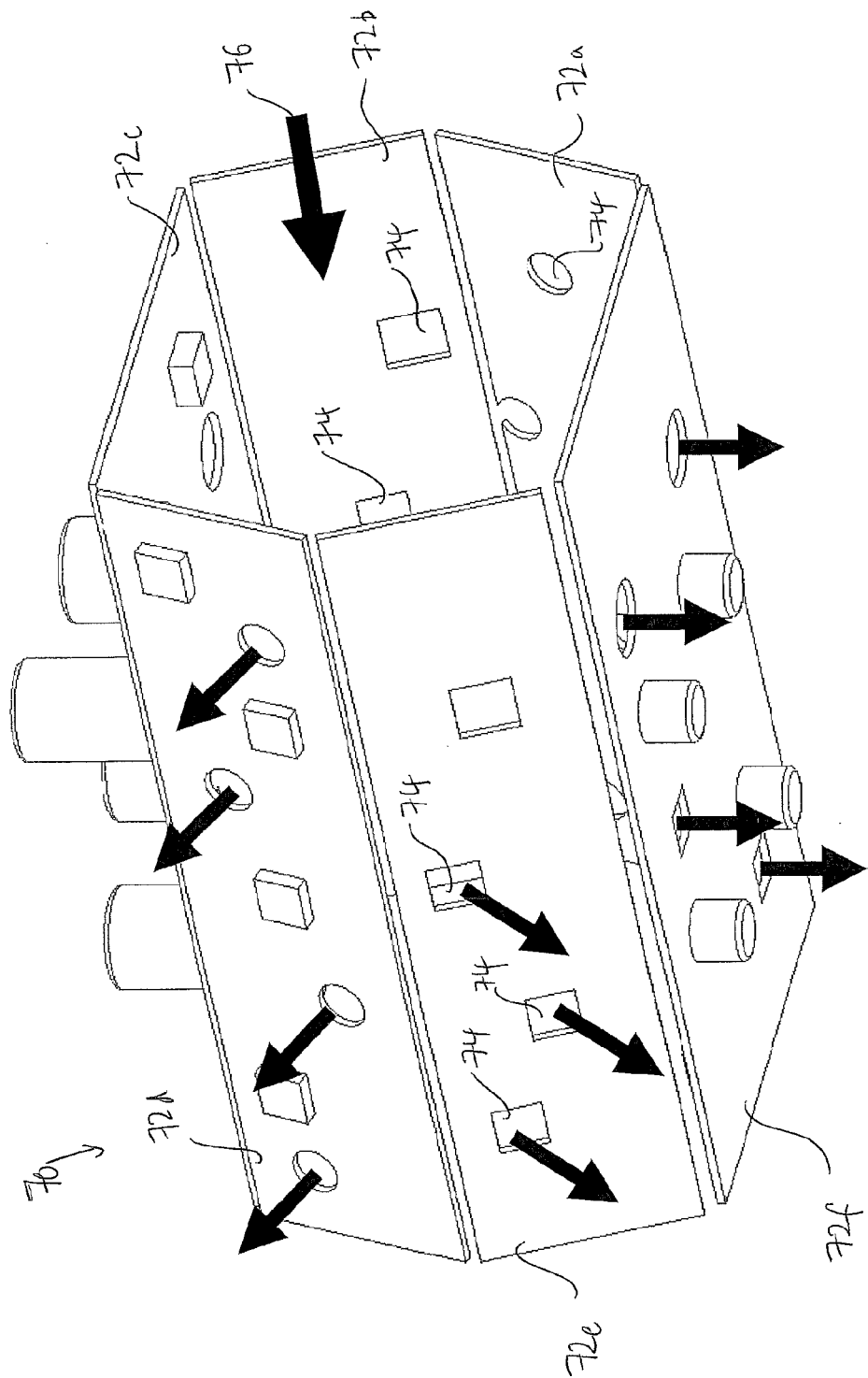
FIG. 10 is a perspective view of an electronic assembly in accordance with a second preferred embodiment of the present invention.

The cooling principle described herein may be extended to a duct having an n-sided polygonal cross-section, for example as illustrated by the duct 70 in FIG. 10. In the embodiment of FIG. 10, duct 70 has a hexangular cross-section and is formed by six PCBs 72a-72f joined together to provide a self-supporting duct or conduit structure. Apertures 74 are formed in PCBs 72a-72f so as to allow air within duct 70 to be pushed or pulled through apertures 74 by an airflow 76 generated along duct 70. Thus, improved cooling of components on PCBs 72a-72f may be achieved, through appropriate positioning of apertures in PCBs 72a-72f relative to the components, or relative to component areas for placement of designated components. Apertures 74 may be apertures formed wholly within PCBs 72a-72f or else may be apertures formed through the contouring of the peripheries of PCBs 72a-72f. Through the appropriate placement of such apertures, downstream portions of heat-generating components may be exposed to airflow through the apertures which may assist in cooling of the components. This principle may be extended to a five-sided duct, a three-sided duct, or indeed any n-sided duct.

Any feature of the above-described embodiments may be combined with the features of another embodiment by making the appropriate changes. Whilst the invention has been described in connection with preferred embodiments, it is to be understood that the invention is not limited to these embodiments, and that alterations, modifications, and variations of these embodiments may be carried out by the skilled person without departing from the scope of the invention.

For example, one or more fans or other airflow generating means may be positioned within the duct and arranged to generate an airflow within the duct. Such an airflow could be largely perpendicular to the PCB, and air could as result be pushed, pulled or otherwise forced through apertures in the PCB.

Furthermore, it should be appreciated that if the airflow generating means of the invention is arranged to suck air along the duct, then, depending on the placement of apertures in the PCB, predominantly upstream portions of the components may be cooled. Cooling of the downstream portions may then be achieved by accordingly positioning a fan to blow or draw air across the first side of the PCB.

The invention claimed is:

1. An electronic assembly comprising:
   a structure;
   a printed circuit board (PCB) connected to the structure to form a duct, wherein the PCB has a first side arranged to receive one or more heat-generating components, and a second side, and wherein the PCB comprises one or more apertures formed therein; and
   airflow generating means arranged to generate an airflow along the duct and along the second side of the PCB such that air is forced through the one or more apertures;
   wherein at least a portion of a periphery of the PCB is contoured such that at least one of the one or more apertures for allowing airflow therethrough is formed between the structure and the periphery of the PCB.

2. The electronic assembly of claim 1, wherein the first side of the PCB faces away from the duct such that heat-generating components received on the first side of the PCB are exterior to the duct.

3. The electronic assembly of claim 1, wherein the airflow generating means is arranged to generate an airflow such that air is pushed through the one or more apertures.

4. The electronic assembly of claim 1, wherein the airflow generating means is arranged to generate an airflow such that air is pulled through the one or more apertures.

5. The electronic assembly of claim 1, wherein the first side of the PCB comprises one or more component areas each arranged to receive one or more heat generating-components.

6. The electronic assembly of claim 5, wherein the contoured portion of the PCB is adjacent one of the one or more component areas, and is contoured inwardly towards the component area.

7. The electronic assembly of claim 6, wherein the contoured portion at least partially conforms to a shape of a heat-generating component to be received in the component area.

8. The electronic assembly of claim 5, wherein the one or more apertures are formed in the PCB such that the air forced through the one or more apertures flows adjacent the one or more component areas.

9. The electronic assembly of claim 1, wherein each component area comprises an upstream area and a downstream area defined relative to the airflow along the duct, and wherein the one or more apertures are formed in the PCB such that the air forced through the one or more apertures flows adjacent the one or more downstream areas.

10. The electronic assembly of claim 1, wherein the airflow along the duct is substantially parallel to the PCB.

11. The electronic assembly of claim 1, wherein the duct has a rectangular cross-section.

12. The electronic assembly of claim 1, wherein the structure comprises a plurality of PCBs arranged in relation to each other such that the duct comprises an n-sided polygonal cross-section.

13. A method for cooling heat-generating components on a printed circuit board (PCB), comprising:
   connecting the PCB to a structure so as to form a duct, wherein the PCB has a first side arranged to receive one or more heat-generating components, and a second side, wherein the PCB comprises one or more apertures formed therein, and wherein at least a portion of a periphery of the PCB is contoured such that at least one of the one or more apertures for allowing airflow therethrough is formed between the structure and the periphery of the PCB; and
   generating an airflow along the duct and along the second side of the PCB so as to force air through the one or more apertures.

14. A printed circuit board (PCB) comprising on a surface thereof a component area arranged to receive a heat-generating component and one or more apertures formed therein, wherein a portion of the periphery of the PCB, adjacent the component area, is contoured inwardly towards the component area such that, when combined with a structure to form a duct, at least one of the one or more apertures for allowing airflow therethrough is formed between the structure and the periphery of the PCB.

15. The PCB of claim 14, wherein the contoured portion of the PCB at least partially conforms to a shape of the heat-generating component to be received in the component area.

16. The PCB of claim 14, wherein the component area comprises the area of the PCB taken up by the heat-generating component when received thereon.

\* \* \* \* \*